US008255838B2

(12) United States Patent
Xue et al.

(10) Patent No.: US 8,255,838 B2
(45) Date of Patent: Aug. 28, 2012

(54) ETCH-AWARE OPC MODEL CALIBRATION BY USING AN ETCH BIAS FILTER

(75) Inventors: Jing Xue, Sunnyvale, CA (US); JenSheng Huang, San Jose, CA (US)

(73) Assignee: Synopsys, Inc., Mountain View, CA (US)

( * ) Notice: Subject to any disclaimer, the term of this patent is extended or adjusted under 35 U.S.C. 154(b) by 279 days.

(21) Appl. No.: 12/688,278

(22) Filed: Jan. 15, 2010

(65) Prior Publication Data

US 2011/0179393 A1 Jul. 21, 2011

(51) Int. Cl.
*G06F 17/50* (2006.01)
(52) U.S. Cl. .......................................... 716/50; 716/54
(58) Field of Classification Search ............... 716/50–56
See application file for complete search history.

(56) References Cited

U.S. PATENT DOCUMENTS

| | | | | |
|---|---|---|---|---|
| 6,526,547 | B2* | 2/2003 | Breiner et al. | 716/56 |
| 7,124,395 | B2* | 10/2006 | Shi et al. | 716/53 |
| 7,266,800 | B2* | 9/2007 | Sezginer | 716/52 |
| 7,444,615 | B2* | 10/2008 | Percin et al. | 716/52 |
| 7,454,739 | B2* | 11/2008 | Huang et al. | 716/51 |
| 7,849,423 | B1* | 12/2010 | Yenikaya et al. | 716/132 |
| 7,934,176 | B2* | 4/2011 | Huang et al. | 716/54 |
| 7,941,768 | B1* | 5/2011 | Wei | 716/54 |
| 8,065,636 | B2* | 11/2011 | Ye et al. | 716/50 |
| 2007/0032896 | A1* | 2/2007 | Ye et al. | 700/108 |
| 2007/0143733 | A1* | 6/2007 | Zach et al. | 716/19 |
| 2009/0276736 | A1* | 11/2009 | Mansfield et al. | 716/4 |
| 2010/0011325 | A1* | 1/2010 | Van Adrichem et al. | 716/5 |
| 2010/0016437 | A1* | 1/2010 | Salvati et al. | 514/567 |
| 2010/0146476 | A1* | 6/2010 | Huang et al. | 716/19 |
| 2010/0229147 | A1* | 9/2010 | Ye et al. | 716/19 |
| 2011/0016437 | A1* | 1/2011 | Scherubl et al. | 716/52 |

OTHER PUBLICATIONS

Shang, Shumay et al., "Etch proximity correction by integrated model-based retargeting and OPC flow", 2007, SPIE, 2007SPIE. 6730E..80S. pp. 1-4.*
Gardin, Christian et al., "Etch modeling for model-based optical proximity correction for 65 nm node", 2007, Elsevier Microelectronics engineering 84 (2007) 770-773 available online at sciencedirect. com. pp. 770-773.*
Nesladek, Pavel, et al., "Time resolved evolution of the etch bias", Proc. SPIE 6533, 65330D (2007); doi:10.1117/12.736925 Grenoble, France 23rd European Mask and Lithography Conference Uwe F. W. Behringer. pp. 1-9.*

* cited by examiner

*Primary Examiner* — Stacy Whitmore
(74) *Attorney, Agent, or Firm* — Park, Vaughan, Fleming & Dowler LLP; Laxman Sahasrabuddhe

(57) ABSTRACT

One embodiment of the present invention relates to a system that constructs and calibrates an etch-aware photolithography model. During operation, the system constructs an etch bias model which models a critical dimension (CD) difference between a measured CD value of a feature after the photolithography process and a measured CD value of the feature after the etch process. The system then fits the photolithography process model based at least on the post-lithography measured CD data and the etch bias model, thereby causing the photolithography process model to be aware of etch effects. The present techniques facilitate bridging the gap between the photolithography and the etch process in the OPC modeling flow. In particular, these techniques can be used to modify conventional staged OPC model or to construct a model based rule table for correcting a retarget model.

19 Claims, 9 Drawing Sheets

ETCH-AWARE OPC MODEL CALIBRATION BY USING AN ETCH BIAS FILTER

BACKGROUND

1. Field

The present invention generally relates to semiconductor design and manufacturing. More specifically, the present invention relates to a method and a system for accurately modeling a manufacturing process which includes sequential steps of photolithography and etching.

2. Related Art

Semiconductor manufacturing technologies typically include a number of processes which involve complex physical and chemical interactions. Since it is almost impossible to find exact formulae to predict the behavior of these complex interactions, developers typically use process models which are fitted to empirical data to predict the behavior of these processes. A semi-empirical process model can be used in a number of applications during the design of a semiconductor chip.

For example, in a technique which is referred to as "Optical Proximity Correction" (OPC), an OPC model is used to make corrections to a semiconductor chip layout (chip layout) to compensate for undesirable optical and resist effects of a photolithography process. Furthermore, OPC models must also account for etch effects that occur due to the structure-etch step and any additional etch steps that follow the photolithography process (i.e., after the photoresist development step). These etch effects are determined by the complex physical, transport, and chemical interactions in an etch chamber. Moreover, the etch effects are heavily influenced by the actual layout of the integrated circuit. For example, different feature sizes in a layout can lead to micro-loading effects and aperture effects. Hence, an accurate OPC model needs to properly describe both the photolithography process and the etch process. In the context of the present invention, an OPC model includes both a photolithography model and an etch model.

Unfortunately, existing OPC models do not compute the combined photolithography-etch effects accurately. One of the inaccuracies of the existing OPC models arises from modeling the non-uniform and non-linear etch bias (hereinafter "etch bias"), defined as a measured difference between a resist contour immediately after the photolithography process and an etch contour immediately after the etch process. This inaccuracy leads to degradation of the overall OPC model quality, especially at the advanced technology nodes where multiple etching techniques have been used to improve printing resolutions.

SUMMARY

One embodiment of the present invention relates to a system that calibrates a photolithography process model for modeling a photolithography process, wherein the photolithography process is followed by an etch process. During operation, the system constructs an etch bias model which models a critical dimension (CD) difference between a measured CD value of a feature after the photolithography process and a measured CD value of the feature after the etch process. The system further receives measured CD data for a layout which is measured after the photolithography process. The system then fits the photolithography process model based at least on the measured CD data and the etch bias model, thereby causing the photolithography process model to be aware of etch effects.

In some embodiments, the system fits the photolithography process model by computing a residue of the photolithography process model based at least on the measured CD data and further computes a residue fitting target based at least on the etch bias model. The system then fits the photolithography process model so that the residue of the photolithography process model is substantially equal to the residue fitting target.

In some embodiments, the system computes the residue of the photolithography process model by: obtaining an output of the photolithography process model; and obtaining the residue of the photolithography process model by taking the difference between the measured CD data and the output of the photolithography process model.

In some embodiments, the system computes the residue fitting target by computing an inverse function of the etch bias model and then normalizing the inversed etch bias model by a set of predetermined values so that the output of the inversed etch bias model has a substantially zero mean.

In some embodiments, the system constructs the etch bias model by modeling the CD difference as functions of a set of pattern geometry parameters of the layout.

In some embodiments, the functions of the set of pattern geometry parameters include a set of polynomial functions of the set of pattern geometry parameters.

In some embodiments, the set of pattern geometry parameters can include one or more of: line-width; line-spacing; trench width; trench density; polygon width; and pattern density.

In some embodiments, after calibrating the photolithography process model, the system further receives an output of the photolithography process model and post-etch measured CD data for the layout which is measured after the etch process. The system then fits an etch process model for modeling the etch process based at least on the post-etch measured CD data and the output of the photolithography process model.

In some embodiments, the system generates an Optical-Proximity-Correction (OPC) model by combining the fitted photolithography process model and the fitted etch process model.

DETAILED DESCRIPTION

The following description is presented to enable any person skilled in the art to make and use the embodiments, and is provided in the context of a particular application and its requirements. Various modifications to the disclosed embodiments will be readily apparent to those skilled in the art, and the general principles defined herein may be applied to other embodiments and applications without departing from the spirit and scope of the present disclosure. Thus, the present invention is not limited to the embodiments shown, but is to be accorded the widest scope consistent with the principles and features disclosed herein.

The data structures and code described in this detailed description are typically stored on a computer-readable storage medium, which may be any device or medium that can store code and/or data for use by a computer system. The computer-readable storage medium includes, but is not limited to, volatile memory, non-volatile memory, magnetic and optical storage devices such as disk drives, magnetic tape, CDs (compact discs), DVDs (digital versatile discs or digital video discs), or other media capable of storing computer-readable media.

The methods and processes described in the detailed description section can be embodied as code and/or data, which can be stored in a computer-readable storage medium as described above. When a computer system reads and executes the code and/or data stored on the computer-readable storage medium, the computer system performs the methods and processes embodied as data structures and code and stored within the computer-readable storage medium.

Furthermore, methods and processes described herein can be included in hardware modules or apparatus. These modules or apparatus may include, but are not limited to, an application-specific integrated circuit (ASIC) chip, a field-programmable gate array (FPGA), a dedicated or shared processor that executes a particular software module or a piece of code at a particular time, and/or other programmable-logic devices now known or later developed. When the hardware modules or apparatus are activated, they perform the methods and processes included within them.

Integrated Circuit Design Flow

Figure 1:
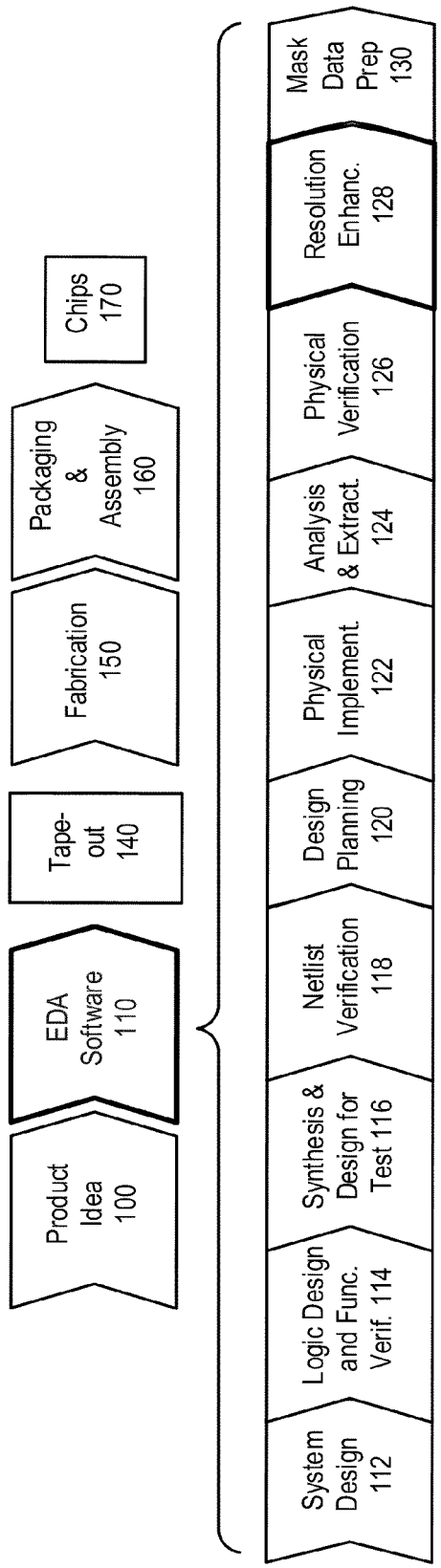
FIG. 1 illustrates various steps in the design and fabrication of an integrated circuit in accordance with an embodiment of the present invention.

FIG. 1 illustrates various steps in the design and fabrication of an integrated circuit. The process starts with the generation of a product idea (stage 100), which is realized using an Electronic Design Automation (EDA) software design process (stage 110). When the design is finalized, it can be taped-out (stage 140). After tape-out, the fabrication process is consummated (stage 150) and packaging and assembly processes (stage 160) are performed which ultimately result in finished chips (stage 170).

The EDA software design process (stage 110), in turn, comprises stages 112-130, which are described below. Note that this design flow description is for illustration purposes only. This description is not meant to limit the present invention. For example, an actual integrated circuit design may require a designer to perform the design stages in a different sequence than the sequence described herein. The following discussion provides further details of the stages in the design process.

System design (stage 112): The designers describe the functionality to implement. They can also perform what-if planning to refine the functionality and to check costs. Hardware-software architecture partitioning can occur at this stage. Exemplary EDA software products from SYNOPSYS, INC. that can be used at this stage include MODEL ARCHITECT®, SABER®, SYSTEM STUDIO®, and DESIGNWARE® products.

Logic design and functional verification (stage 114): At this stage, the VHDL or Verilog code for modules in the system is written and the design is checked for functional accuracy. More specifically, the design is checked to ensure that it produces the correct outputs. Exemplary EDA software products from SYNOPSYS, INC. that can be used at this stage include VCS®, VERA®, DESIGNWARE®, MAGELLAN®, FORMALITY®, ESP® and LEDA® products.

Synthesis and design (stage 116): Here, the VHDL/Verilog is translated to a netlist. The netlist can be optimized for the target technology. Additionally, tests can be designed and implemented to check the finished chips. Exemplary EDA software products from SYNOPSYS, INC. that can be used at this stage include DESIGN COMPILER®, PHYSICAL COMPILER®, TEST COMPILER®, POWER COMPILER®, FPGA COMPILER®, TETRAMAX®, and DESIGNWARE® products.

Netlist verification (stage 118): At this stage, the netlist is checked for compliance with timing constraints and for correspondence with the VHDL/Verilog source code. Exemplary EDA software products from SYNOPSYS, INC. that can be used at this stage include FORMALITY®, PRIMETIME®, and VCS® products.

Design planning (stage 120): Here, an overall floor plan for the chip is constructed and analyzed for timing and top-level routing. Exemplary EDA software products from SYNOPSYS, INC. that can be used at this stage include ASTRO® and IC COMPILER® products.

Physical implementation (stage 122): The placement (positioning of circuit elements) and routing (connection of the same) occurs at this stage. Exemplary EDA software products from SYNOPSYS, INC. that can be used at this stage include the ASTRO® and IC COMPILER® products.

Analysis and extraction (stage 124): At this stage, the circuit function is verified at a transistor level; this, in turn, permits what-if refinement. Exemplary EDA software products from SYNOPSYS, INC. that can be used at this stage include ASTRORAIL®, PRIMERAIL®, PRIMETIME®, HSPICE®, HSIM®, NANOTIME®, NANOSIM® and STAR-RCXT® products.

Physical verification (stage 126): In this stage, the design is checked to ensure correctness for manufacturing, electrical issues, lithographic issues, and circuitry. Exemplary EDA software products from SYNOPSYS, INC. that can be used at this stage include the HERCULES® product.

Resolution enhancement (stage 128): This stage involves geometric manipulations of the layout to improve manufacturability of the design. Exemplary EDA software products from SYNOPSYS, INC. that can be used at this stage include PROTEUS®, PROTEUS®AF, and PSMGED® products.

Mask data preparation (stage 130): This stage provides the tape-out data for production of masks to produce finished chips. Exemplary EDA software products from SYNOPSYS, INC. that can be used at this stage include the CATS® family of products.

Embodiments of the present invention can be used during one or more of the above-described steps. Specifically, one embodiment of the present invention can be used during the resolution enhancement step 128.

Terminology

Throughout the specification, the terms "photolithography" and "lithography" are used interchangeably.

OPC Model Calibration

Note that the accuracy of the OPC model can limit both the effectiveness of corrected mask patterns and the correctness of post-OPC design layout verification. To generate an accurate OPC model, a fitting process is often performed, which is often referred to as "OPC model calibration." One objective of OPC model calibration is to minimize the difference (or "the residue") between model-generated CD values for a set of layout patterns (or "model CDs") and corresponding measured CD values on a set of test patterns (or "wafer CDs").

A semiconductor manufacturing process typically includes a lithography process followed by an etch process. More specifically, the lithography process involves a photoresist exposure step using a mask, which is followed by a photoresist development step which transfers the mask patterns onto the photoresist layer. Next, the etch process transfers the mask patterns from the photoresist layer onto a wafer layer underneath the photoresist layer. In the discussion below, we refer to the wafer CDs obtained immediately after the photoresist development step as "post-litho measured data." In some embodiments, the post-litho measured data is measured from a resist profile on the wafer. Further, we refer to the wafer CDs obtained immediately after the etch process as "post-etch measured data." In some embodiments, the post-etch measured data is measured from an etch profile on the wafer.

Note that an OPC model models both the lithography process (including the optical effects and the resist effects) and the etch process (i.e., the etch effects). While a conventional lithography model only accounts for the lithography process, an OPC model needs to properly integrate the etch effects with a conventional lithography model. The particular technique used to integrate the etch effects with a conventional lithography model can have a significant impact on the accuracy of the overall OPC model.

Figure 2A:
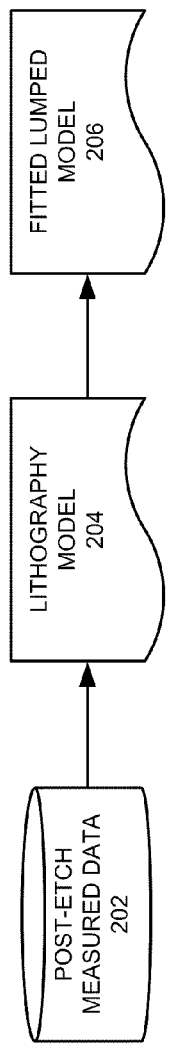
FIG. 2A provides a schematic illustrating a process for fitting an OPC model based on a lumped model.
Figure 2B:
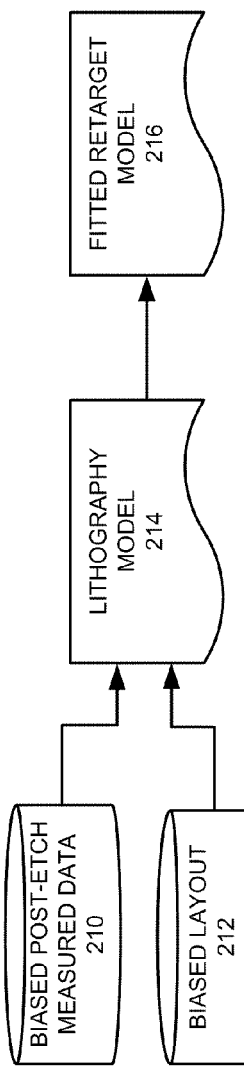
FIG. 2B provides a schematic illustrating a process for fitting an OPC model based on a retarget model.
Figure 2C:
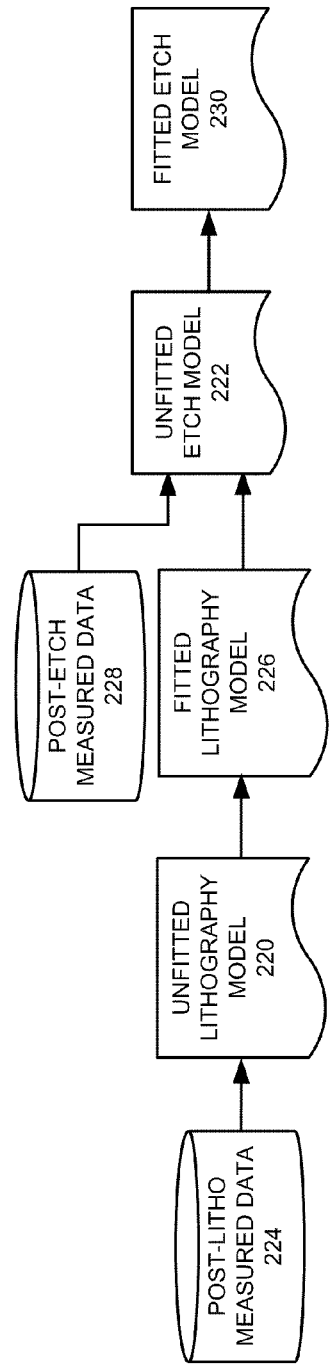
FIG. 2C provides a schematic illustrating a process for fitting an OPC model based on a staged model.

Conventionally, three modeling techniques are often used to include the etch effects in an OPC model during the OPC model calibration. These are the lumped model, the retarget model, and the staged model. FIGS. 2A-2C provide schematics illustrating the lumped model, the retarget model, and the staged model, respectively.

More specifically, FIG. 2A provides a schematic illustrating a process for fitting an OPC model based on a lumped model. As illustrated in FIG. 2A, during OPC model calibration based on a lumped model, post-etch measured data 202 is used to fit a lithography model 204, which subsequently generates a fitted lumped model 206. More specifically, the fitting process of FIG. 2A generally uses the optical and resist model components of lithography model 204 and the Gaussian load kernel to directly calibrate post-etch measured data 202. Unfortunately, the lumped model ignores the intermediate measurement results obtained immediately after the photoresist development (i.e., the post-litho measured data). As a result, depending on the amount of the bias, the lumped model may distort the optical image surface, change the mutual coherence properties, and lose the lithography process window information.

FIG. 2B provides a schematic illustrating a process for fitting an OPC model based on a retarget model. As illustrated in FIG. 2B, during OPC model calibration based on a retarget model, both the design layout and the post-etch measured data are typically biased based on values stored in a rule table to account for the etch effects. The modified data, i.e., biased post-etch measured data 210 and biased layout 212, is then used to fit a lithography model 214, which subsequently generates a fitted retarget model 216. The retarget model fitting process of FIG. 2B has the advantages of using one stage correction flow while maintaining the lithographic model properties. However, the rule table which is generated based on previous measurement data is required for the retargeting operation, and therefore the OPC model fidelity and accuracy are limited by the previously measured pattern structure and the measurement qualities.

FIG. 2C provides a schematic illustrating a process for fitting an OPC model based on a staged model. As illustrated in FIG. 2C, during OPC model calibration based on a staged model, the lithography process and the etch process are modeled separately in two stages. More specifically, the stage model comprises an unfitted lithography model 220, which models the lithography process, followed by an unfitted etch model 222, which models the etch process. Moreover, unfitted lithography model 220 is calibrated by using post-litho measured data 224, which subsequently generates a fitted lithography model 226. Next, unfitted etch model 222 is calibrated by using both post-etch measured data 228 and output of fitted lithography model 226, which subsequently generates a fitted etch model 230. The staged model, which includes fitted lithography model 226 and fitted etch model 230, provides the advantages of tracking and verifying specific behaviors for each process without degrading individual modeling properties to adapt the other process. Unfortunately, traditional staged models calibrate the lithography model independently without considering the effects from the etch model. Because the post-litho measurement data used to calibrate the lithography model can be noisy and the lithography model output is an input to the etch model in a staged model flow, the staged model accuracy is limited by the accuracy of the lithography model.

Etch-Aware OPC Model Calibration

One embodiment of the present invention provides a technique for including etch effects in a lithography model during an OPC model calibration process. More specifically, the system calibrates the lithography model with an objective of driving the residue of the lithography model to equal an etch-related bias. In one embodiment, this etch-related bias is generated based on the etch bias, which is defined as the difference between the post-litho measured data and post-etch measured data at corresponding locations on a wafer. In the discussion below, we denote the post-litho measured data as "ADI_wafer" because the data is obtained during the after-photoresist-development inspection (ADI) step. We similarly denote the post-etch measured data as "AEI_wafer" because the data is obtained during the after-etch inspection (AEI) step. Hence, the etch bias can be expressed as:

$$\text{bias} = \text{AEI\_wafer} - \text{ADI\_wafer}. \tag{1}$$

Note that each bias value is computed at a specific inspection location on the wafer. We hereinafter use the terms "post-litho measured data" and "ADI_wafer" interchangeably. Further, the terms "post-etch measured data" and "AEI_wafer" are used interchangeably.

In some embodiments, such as during a staged model calibration, the post-litho measured data is the input to the lithography model. We denote the output of the lithography model as ADI_model, and the residue of the lithography model as $R_{litho}$. Hence, the lithography model residue can be expressed as:

$$R_{litho} = \text{ADI\_wafer} - \text{ADI\_model}. \tag{2}$$

Conventionally, calibrating the lithography model causes ADI_model to match ADI_wafer, which results in a minimized model residue. However, when ADI_wafer cannot be accurately measured, the conventional calibration technique does not produce an accurate lithography model by simply fitting ADI_model to ADI_wafer.

In one embodiment, the system includes the etch effects into the lithography model by fitting the lithography model residue to the inverse of the etch bias such that:

$$R_{litho} \doteq -\text{bias}, \tag{3}$$

wherein the "$\doteq$" symbol represents a fitting operation. Note that in this embodiment the objective of lithography model calibration changes from minimizing $R_{litho}$ to making $R_{litho}$ follow the trend of the inverse of the etch bias model. We also referred to Eqn. (3) as an "inverse bias filter," or an "inverse bias model."

Figure 3:
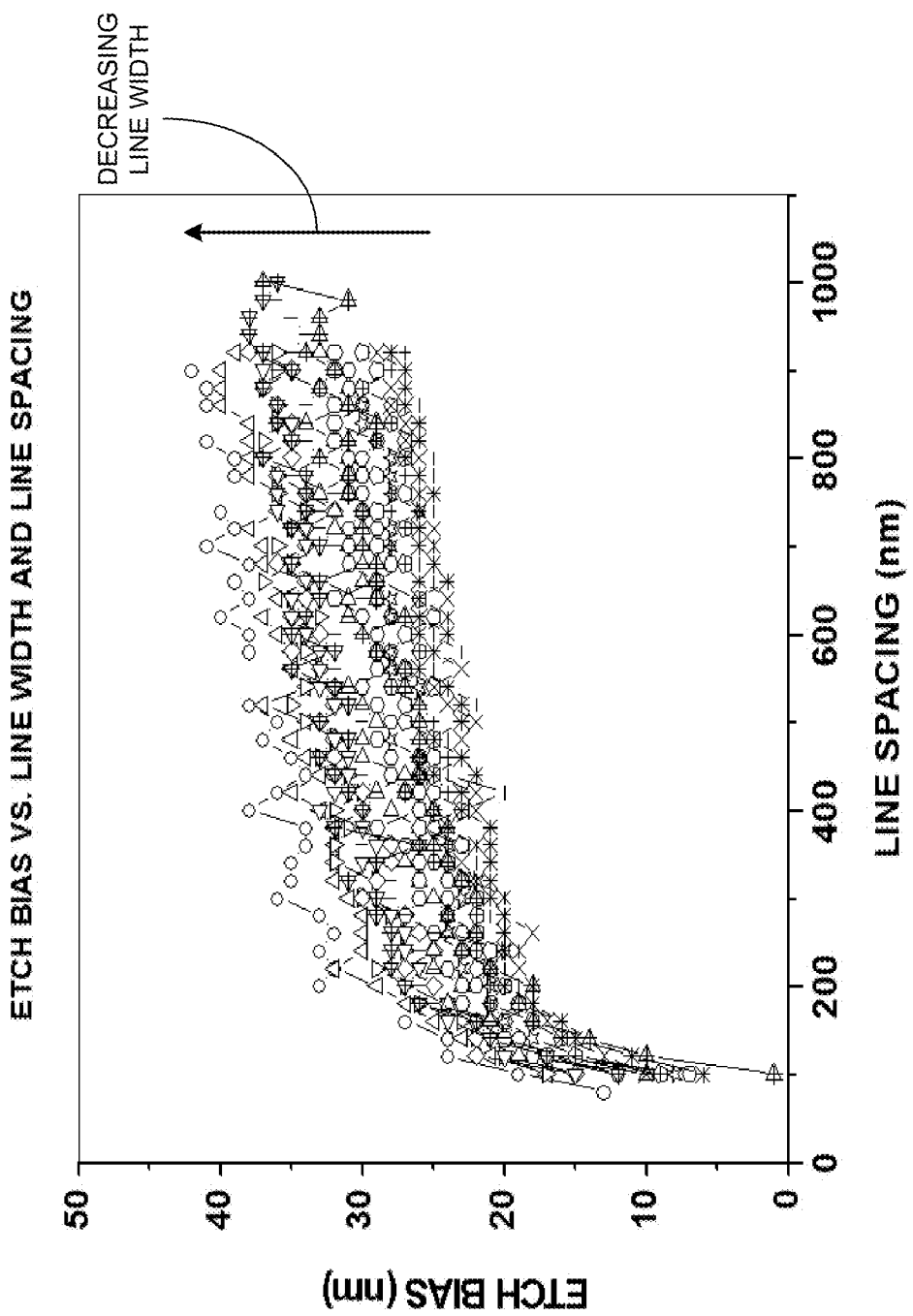
FIG. 3 illustrates measured etch bias data as a function of two pattern geometry parameters: line-width and line-spacing of a layout.

FIG. 3 illustrates measured etch bias data as a function of two pattern geometry parameters: line-width and line-spacing of a layout. Note that the plot of FIG. 3 comprises a set of etch bias curves, wherein each curve represents the measured etch bias values (the vertical axis) at a constant line-width as a function of different line-spacings (the horizontal axis), and the set of curves correspond to a set of line-widths. As illustrated in FIG. 3, each etch bias curve displays an increasing trend with respect to an increasing line-spacing. Moreover, the set of etch bias curves displays an increasing trend with respect to a decreasing line-width. Because the etch bias is a function of pattern geometry parameters, the etch bias values should be determined based on the location of the layout where the residue is computed when calibrating the lithography model based on Eqn. (3).

In one embodiment of the present invention, the etch bias is modeled as a function of one or more pattern geometry parameters. These pattern geometry parameters can include, but are not limited to, line-width, line-spacing, trench width, trench density, polygon width, and pattern density. For example, an etch bias model based on two pattern geometry parameters has the following form:

$$\text{bias}_i = a_{i0} + a_{i1}x + a_{i2}x^2 + \ldots + a_{in}x^n, (i=0,1,\ldots,k), \tag{4}$$

wherein x represents the first pattern geometry parameter, n represents the number of polynomial terms, and $a_{i0}$, $a_{i1}$, $a_{i1}$, ..., $a_{in}$ (hereinafter shorten to "$a_{ij}$") is the coefficient of the bias function $\text{bias}_i$. Furthermore, note that each of the k bias functions $\text{bias}_i$ corresponds to a different value of the second pattern geometry parameter. Consequently, each equation in Eqn. (4) computes the etch bias as a function of the first pattern geometry parameter when the value of the second pattern geometry parameter remains a constant.

Note that Eqn. (4) may be written in matrix form as:

$$\text{bias}_i = a_{bias} \cdot x_{bias}, \tag{5}$$

$$\text{wherein } a_{bias} = \begin{bmatrix} a_{00} & a_{01} & \ldots & a_{0n} \\ a_{10} & a_{11} & \ldots & a_{1n} \\ a_{20} & a_{21} & \ldots & a_{2n} \\ & & \vdots & \\ a_{k0} & a_{k1} & \ldots & a_{kn} \end{bmatrix},$$

$$\text{and } x_{bias} = \begin{bmatrix} 1 \\ x \\ x^2 \\ \vdots \\ x^n \end{bmatrix}.$$

Hence, the inverse bias filter of Eqn. (3) can be rewritten as:

$$R_{litho} \doteq -a_{bias} \cdot x_{bias}. \tag{6}$$

After constructing the set of bias functions, the coefficient $a_{ij}$ can be determined by fitting the set of the bias functions with measured etch bias data. Note that the number of terms n in each bias function can be decided during the fitting process to control the fitting accuracy. In some embodiments, n has a value of 3 or 4.

For example, in an etch bias model based on line-width and line-spacing, the line-spacing may be represented by the variable x in Eqn. (5), while the line-width may be represented by the set of bias functions $\text{bias}_i$ wherein each bias function corresponds to a different line-width. In this embodiment, the coefficient $a_{ij}$ can be determined by fitting the set of the bias functions to the measured etch bias data such as those shown in FIG. 3. In another embodiment, the line-width can be represented by the variable x in Eqn. (5), while the line-spacing may be represented by the set of bias functions $\text{bias}_i$ so that each bias function corresponds to a different line-spacing.

In some embodiments, an etch bias model based on three pattern geometry parameters has the following form:

$$\text{bias}_{ij} = a_{ij0} + a_{ij1}x + a_{ij2}x^2 + \ldots + a_{ijn}x^n, (i=0,1,\ldots,k; j=0,1,\ldots,l), \tag{7}$$

wherein x represents the first pattern geometry parameter, and $a_{ij0}$, $a_{ij1}$, $a_{ij2}$, ..., $a_{ijn}$ (hereinafter shorten to "$a_{ijm}$") is the coefficient of the bias function $\text{bias}_{ij}$. Furthermore, note that there are k×l bias functions in Eqn. (7) which correspond to different values of the second and third pattern geometry parameters. Similarly, the coefficient $a_{ijm}$ can be determined by fitting the set of the bias functions with measured etch bias data.

Note that not all of the pattern geometry parameters are independent. For example, one pattern geometry parameter may be derived from one or more of the other pattern geometry parameters. Hence, the etch bias functions do not have to include many pattern geometry parameters. In some embodiments, etch bias functions including two or three pattern geometry parameters may be sufficient.

Figure 4:
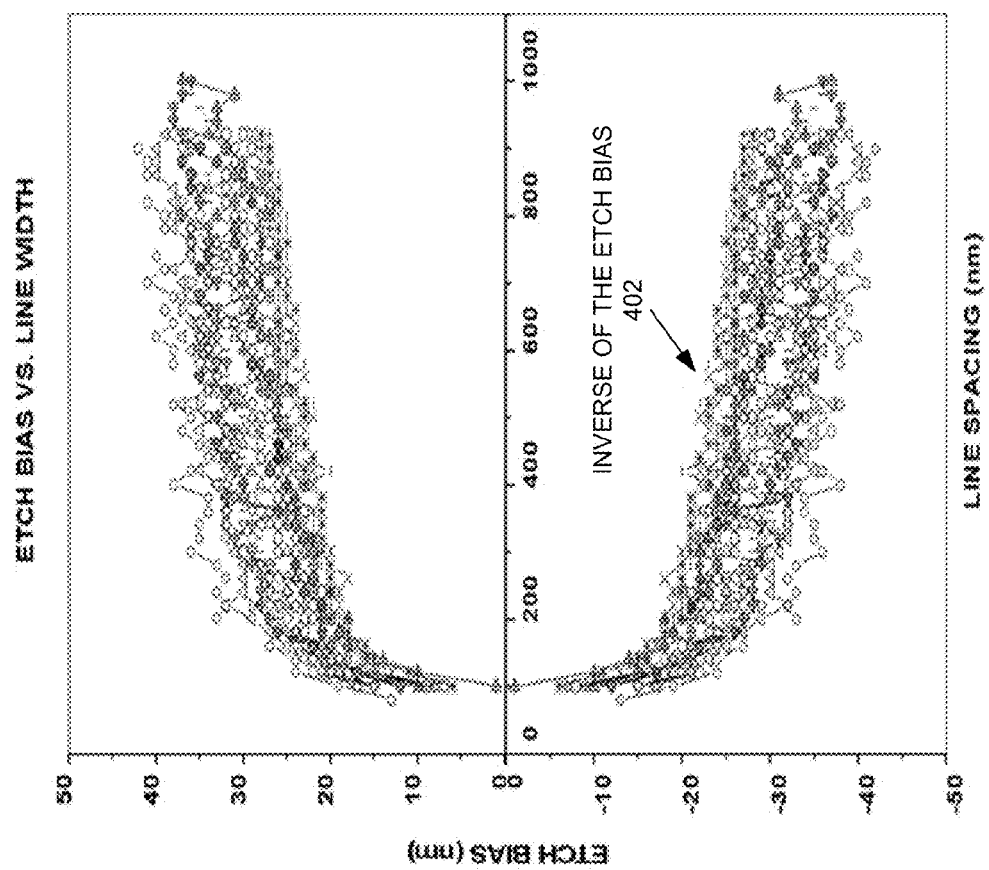
FIG. 4 illustrates both the etch bias data of FIG. 3 and the inverse of the etch bias data in accordance with an embodiment of the present invention.

FIG. 4 illustrates both the etch bias data of FIG. 3 and the inverse of the etch bias data in FIG. 3 in accordance with an embodiment of the present invention. Note that for the purposes of explaining the following model fitting process, the inverse of the measured etch bias data 402 in FIG. 4 is primarily used to illustrate the trend of the inverse bias data. However, in the embodiments of the present invention, the fitted inverse bias data, generated from the inverse bias model, is used in the photolithography model calibration, but not the inverse of the measured etch bias data. As illustrated in FIG. 4, the inverse of the etch bias data 402 comprises primarily negative values having a range between 0 to −50 nm. Using the inverse bias model described by Eqn. (6), the lithography model residue is fitted to predominantly negative values with a mean value around −25 nm.

In some embodiments however, in order to trace the lithography behavior and maintain the accuracy of the lithography model, it may be desirable to fit the lithography model residue to the reversed etch bias with a mean value substantially equal to zero. This can be achieved by adding a second term to the inverse bias filter of Eqn. (6) to adjust mean values in the first term so that the sum of the two terms yields fitting targets that have substantially zero means:

$$R_{litho} = -a_{bias} \cdot x_{bias} + C, \tag{8}$$

wherein C is a programmed constant bias matrix $$C = \begin{bmatrix} C_0 \\ C_1 \\ C_2 \\ \vdots \\ C_n \end{bmatrix}.$$

For example, if the first line-width corresponds to an inverse bias $-bias_0$ between (−20 nm, −40 nm), the system can choose the programmed constant $C_0$ to be around 30 nm, so that the shifted fitting target for the first line-width is between (−10 nm, 10 nm). Similarly, if the second line-width corresponds to an inverse bias $-bias_1$ between (−25 nm, −45 nm), the system can choose the programmed constant $C_1$ to be around 35 nm, so that the shifted fitting target for the first line-width is also between (−10 nm, 10 nm). Note that shifting the reversed etch bias with the programmed constants C facilitates generating residue fitting targets which fall between a common range which has a substantially zero mean.

Figure 5:
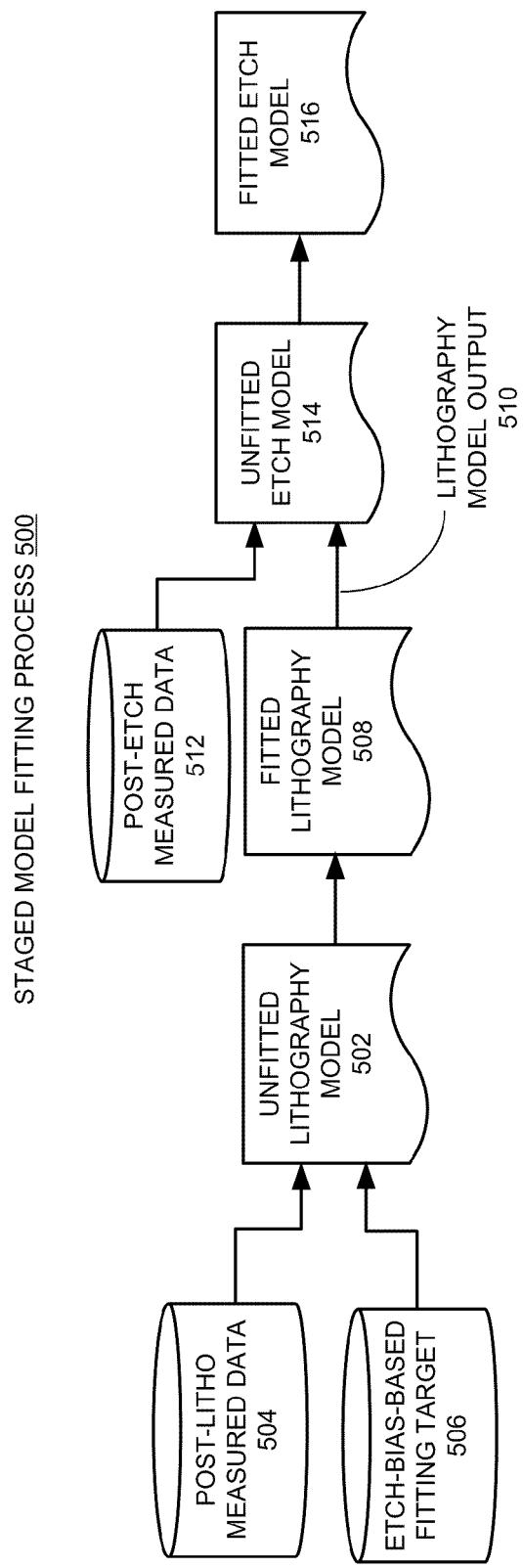
FIG. 5 illustrates a modified staged model fitting process based on an etch-aware lithography model in accordance with an embodiment of the present invention.

FIG. 5 illustrates a modified staged model fitting process 500 based on an etch-aware lithography model in accordance with an embodiment of the present invention. Note that modified staged model fitting process 500 is a modified version of the model fitting process described in FIG. 2C. As illustrated in FIG. 5, an unfitted lithography model 502 in model fitting process 500 receives both post-litho measured data 504 and an etch-bias-based fitting target 506 as inputs. In one embodiment, etch-bias-based fitting target 506 is computed from and is the output of an etch-bias-based residue model based on Eqn. (8). During the lithography model calibration process, the system fits lithography model 502 so that the associated lithography model residue is substantially equal to etch-bias-based fitting target 506. Because the etch effects are built into etch-bias-based fitting target 506, the lithography model fitting process generates fitted lithography model 508 which also includes the etch effects.

Lithography model output 510 of fitted lithography model 508 and post-etch measured data 512 are the inputs to an unfitted etch model 514. Next, unfitted etch model 514 is calibrated by using both post-etch measured data 512 and lithography model output 510, which subsequently generates a fitted etch model 516. The modified staged model generated by fitting process 500 includes fitted lithography model 508 and fitted etch model 516.

Figure 6:
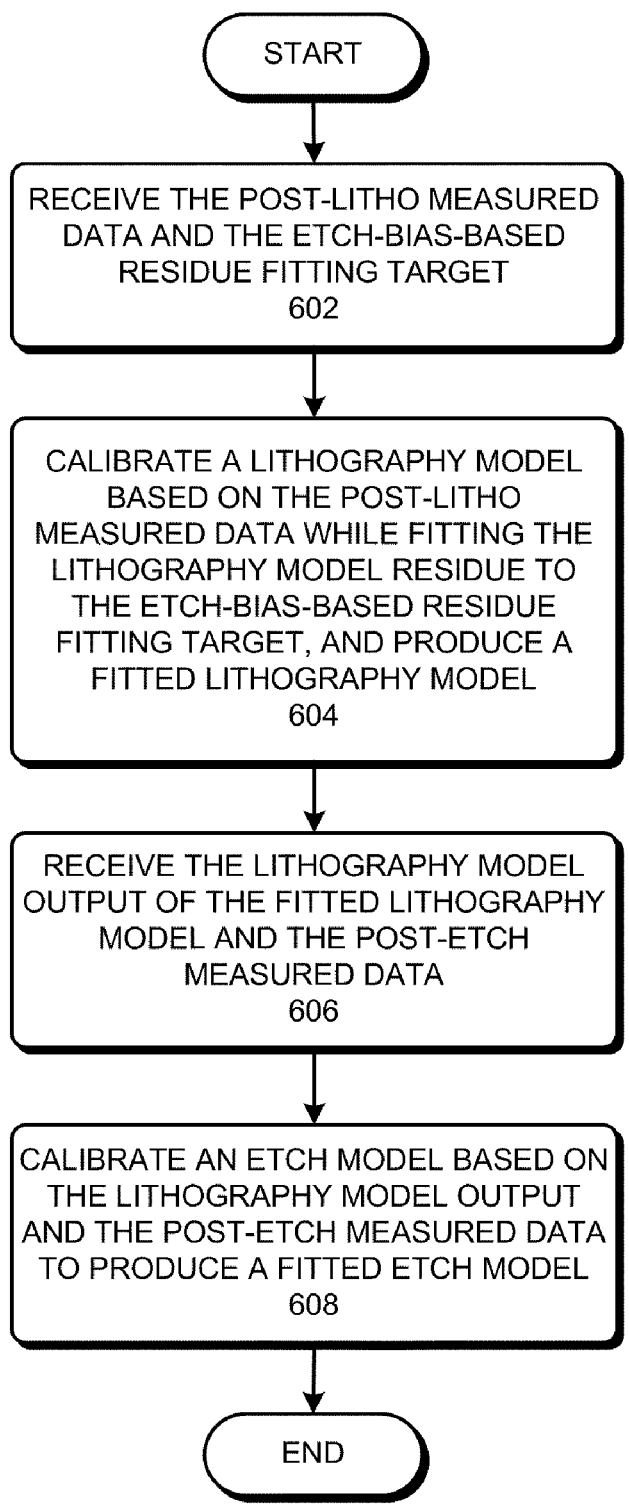
FIG. 6 presents a flowchart illustrating a process of calibrating an OPC model based on a modified staged model in accordance with an embodiment of the present invention.

FIG. 6 presents a flowchart illustrating a process of calibrating an OPC model based on a modified staged model in accordance with an embodiment of the present invention.

During operation, the system receives the post-litho measured data and the etch-bias-based residue fitting target (step 602). In one embodiment, the etch-bias-based residue fitting target is computed based on an inverse bias model which includes a reversed-etch-bias term. For example, the etch-bias-based residue fitting target may be computed based on Eqn. (3) or Eqn. (8). In a further embodiment, the system computes the etch bias by constructing the etch bias model as a function of a set of pattern geometry properties.

The system then calibrates a lithography model based on the post-litho measured data while fitting the lithography model residue to the etch-bias-based residue fitting target (step 604). This calibration process then produces a fitted lithography model. Next, the system receives the output of the fitted lithography model and the post-etch measured data (step 606). The system subsequently calibrates an etch model based on the lithography model output and the post-etch measured data to produce a fitted etch model (step 608).

Referring to FIG. 2B, note that the difference between the lithography model output and the post-etch measured data is also the residue of the retarget model (or "retarget model residue"), denoted as $R_{retarget}$. Hence, $R_{retarget}$ can be expressed as:

$$R_{retarget} = AEI\_wafer - ADI\_model. \tag{9}$$

By using the inverse bias filter, Eqn. (9) can be rewritten as:

$$\begin{aligned} R_{retarget} &= (AEI\_wafer - ADI\_wafer) + \\ &\quad (ADI\_wafer - ADI\_model) \\ &= bias + R_{litho} \\ &= bias - bias + C \\ &= C \end{aligned} \tag{10}$$

Note that the retarget model residue in Eqn. (10) is reduced to a set of constant values C because the lithography model residue computed based on Eqn. (8) removes the trend in the etch bias data. According to the result of Eqn. (10), for a two-parameter etch bias model of line-width and line-spacing, the inverse bias filter provides a constant bias for each given line-width, wherein the trend in the original etch bias curves is removed by using the etch-bias-based residue fitting target in the lithography model calibration. Also note that the retarget model residue $R_{retarget}$ can be used to construct the rule table for the retarget model. In one embodiment, the rule table based on Eqn. (10) resembles a step function.

Figure 7:
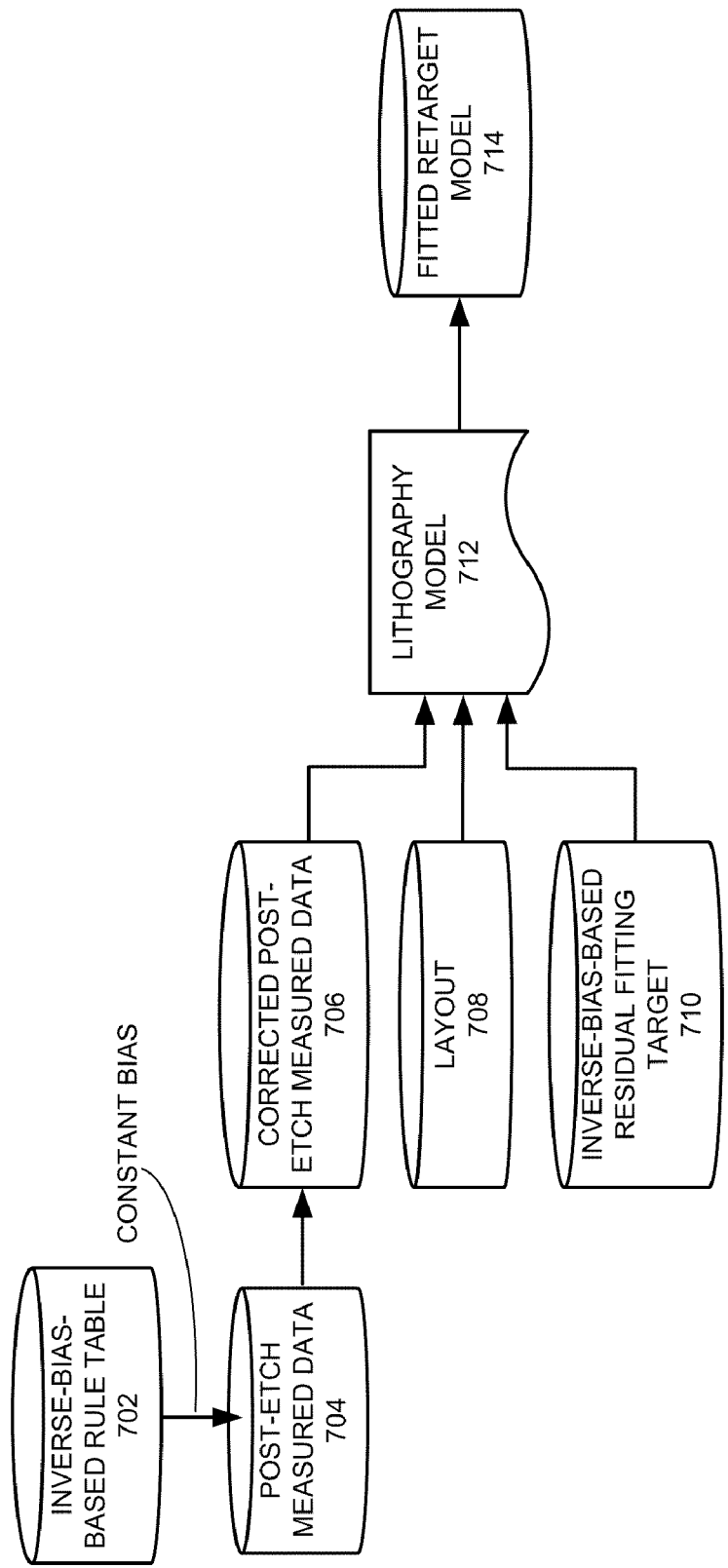
FIG. 7 illustrates a modified retarget model fitting process based on a model-based rule table in accordance with an embodiment of the present invention.

FIG. 7 illustrates a modified retarget model fitting process 700 based on a model-based rule table in accordance with an embodiment of the present invention. Note that modified retarget model fitting process 700 is a modified version of the model fitting process described in FIG. 2B. As illustrated in FIG. 7, an inverse-bias-based rule table 702, which was computed based on Eqn. (10), is used to adjust post-etch measured data 704 to generate corrected post etch measured data 706. The corrected post etch measured data 706, a layout 708, and an inverse-bias-based residual fitting target 710, are inputs to a lithography model 712. In one embodiment, etch-bias-based residual fitting target 710 is computed from and is the output of an etch-bias-based residue model based on Eqn. (8). The output of lithography model 712 is a fitted retarget model 714.

Figure 8:
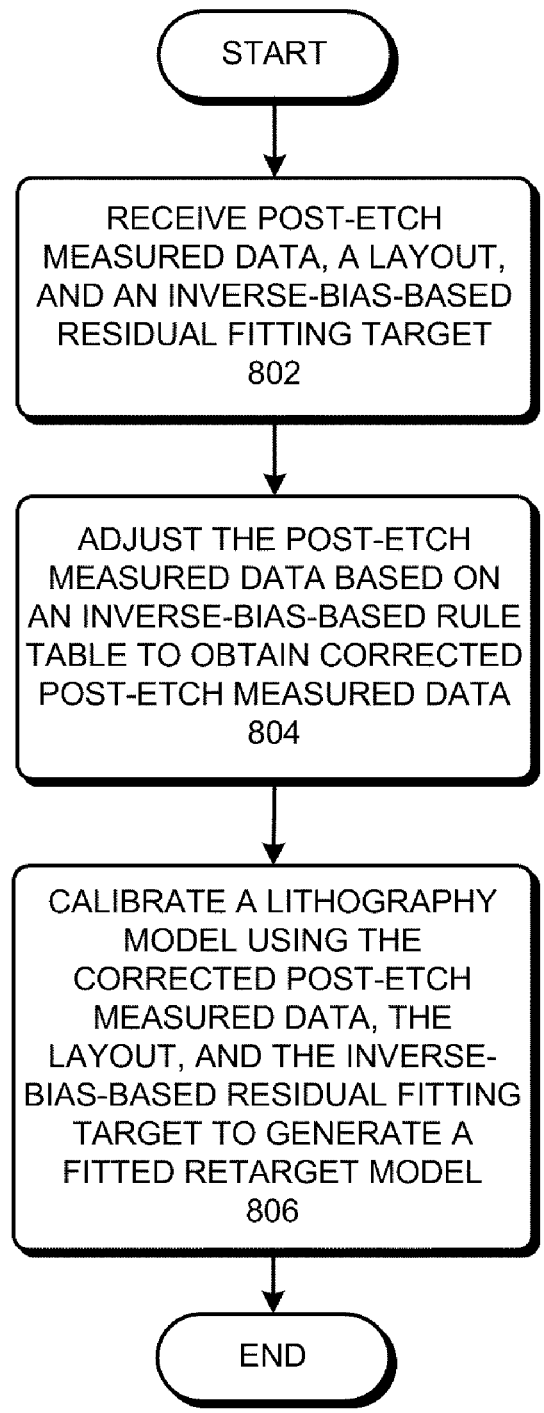
FIG. 8 presents a flowchart illustrating a process of calibrating an OPC model based on a modified retarget model in accordance with an embodiment of the present invention.

FIG. 8 presents a flowchart illustrating a process of calibrating an OPC model based on a modified retarget model in accordance with an embodiment of the present invention.

During operation, the system receives post-etch measured data, a layout and an inverse-bias-based residual fitting target (step 802). The system then adjusts the post-etch measured data based on an inverse-bias-based rule table to obtain corrected post-etch measured data (step 804). The system next calibrates a lithography model by using the corrected post-etch measured data, the layout, and the inverse-bias-based residual fitting target, which subsequently generates a fitted retarget model (step 806).

Note that while FIGS. 7 and 8 describe a modified retarget model fitting process which applies the inverse-bias-based rule table to the input to the lithography model prior to calibrating the lithography model, another embodiment of the present invention does not use the inverse-bias-based rule table at the input of the lithography model. Instead, this embodiment uses the inverse-bias-based rule table to adjust the output of the lithography model calibration. The modified lithography model output is then the result of the fitted retarget model.

Figure 9:
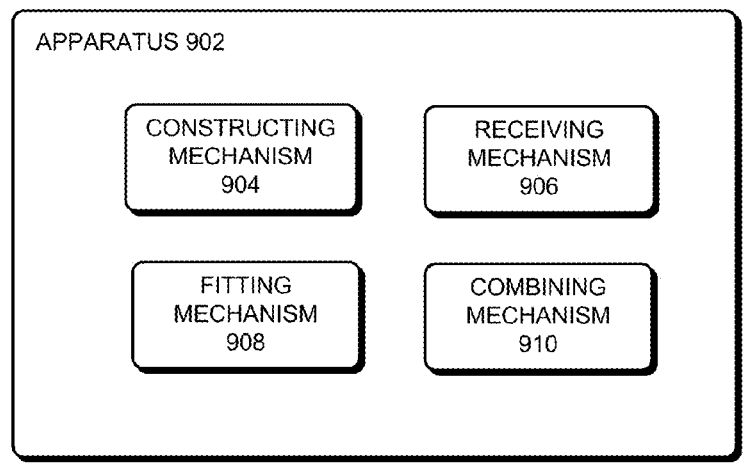
FIG. 9 illustrates an apparatus that generates an Optical-Proximity-Correction (OPC) model in accordance with an embodiment of the present invention.

FIG. 9 illustrates an apparatus that generates an Optical-Proximity-Correction (OPC) model in accordance with an embodiment of the present invention.

Apparatus 902 can comprise mechanisms which communicate with one another via a wired or wireless communication channel. Specifically, apparatus 902 can comprise a constructing mechanism 904, a receiving mechanism 906, a fitting mechanism 908, and a combining mechanism 910. Each of the above mechanisms may be realized using one or more integrated circuits or as a module of a general purpose processor. Apparatus 902 can be part of a computer system.

In some embodiments, constructing mechanism 904 may be configured to construct an etch bias model which models a CD difference between a measured CD value of a feature after the photolithography process and a measured CD value of the feature after the etch process; receiving mechanism 906 may be configured to receive measured CD data for a layout which is measured after the photolithography process; fitting mechanism 908 may be configured to fit a photolithography process model which models the photolithography process based at least on the measured CD data and the etch bias model, thereby causing the photolithography process model to be aware of etch effects. Receiving mechanism 906 may be further configured to receive an output of the photolithography process model and post-etch measured CD data for the layout which is measured after the etch process; fitting mechanism 908 may be further configured to fit an etch process model for modeling the etch process based at least on the post-etch measured CD data and the output of the photolithography process model. Finally, combining mechanism 910 may be configured to generate an OPC model by combining the fitted photolithography process model and the fitted etch process model.

Figure 10:
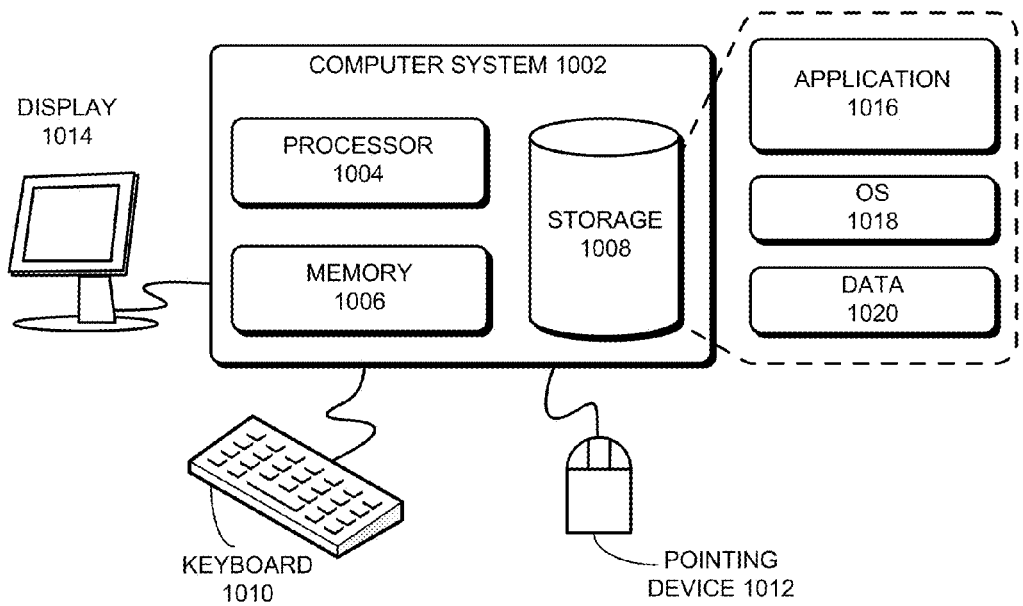
FIG. 10 illustrates a computer system in accordance with an embodiment of the present invention.

FIG. 10 illustrates a computer system in accordance with an embodiment of the present invention.

A computer system can generally be any system that can perform computations. Specifically, a computer system can be a microprocessor, a network processor, a portable computing device, a personal organizer, a device controller, or a computational engine within an appliance, or any other computing system now known or later developed. Computer system 1002 comprises processor 1004, memory 1006, and storage 1008. Computer system 1002 can be coupled with display 1014, keyboard 1010, and pointing device 1012. Storage 1008 can generally be any device that can store data. Specifically, a storage device can be a magnetic, an optical, or a magneto-optical storage device, or it can be based on flash memory and/or battery-backed up memory. Storage 1008 can store application 1016, operating system 1018, and data 1020.

Application 1016 can include instructions that when executed by computer 1002 cause computer 1002 to perform one or more processes described in this disclosure. Data 1020 can include any data that is required as input or that is generated as output by the methods and/or processes described in this disclosure.

CONCLUSION

Embodiments of the present invention provide techniques for building an etch-aware lithography model which facilitates bridging the gap between the lithography and the etch process in the OPC modeling flow. For example, embodiments of the present invention provide techniques for modifying conventional staged OPC model. Embodiments of the present invention also provide techniques for building a model-based rule table for correcting a retarget OPC model while preserving the lithography modeling accuracy level. These techniques can be applied to the double patterning, multiple patterning photolithography processes, and semiconductor manufacturing involving multiple etching steps.

The foregoing descriptions of embodiments of the present invention have been presented only for purposes of illustration and description. They are not intended to be exhaustive or to limit the present invention to the forms disclosed. Accordingly, many modifications and variations will be apparent to practitioners skilled in the art. Additionally, the above disclosure is not intended to limit the present invention. The scope of the present invention is defined by the appended claims.

What is claimed is:

1. A method for calibrating a photolithography process model for modeling a photolithography process, wherein the photolithography process is followed by an etch process, the method comprising:
    constructing an etch bias model which models a critical dimension (CD) difference between a measured CD value of a feature after the photolithography process and a measured CD value of the feature after the etch process;
    receiving measured CD data for a layout which is measured after the photolithography process; and
    fitting, by computer, the photolithography process model based at least on the measured CD data and the etch bias model, wherein said fitting involves:
        computing a residue of the photolithography process model based at least on the measured CD data;
        computing a residue fitting target based at least on the etch bias model; and
        fitting the photolithography process model so that the residue of the photolithography process model is substantially equal to the residue fitting target.

2. The method of claim 1, wherein computing the residue of the photolithography process model involves:
    obtaining an output of the photolithography process model; and
    obtaining the residue of the photolithography process model by taking the difference between the measured CD data and the output of the photolithography process model.

3. The method of claim 1, wherein computing the residue fitting target involves:
    computing an inverse function of the etch bias model; and
    normalizing the inversed etch bias model by a set of predetermined values so that the output of the inversed etch bias model has a substantially zero mean.

4. The method of claim 1, wherein constructing the etch bias model involves modeling the CD difference as functions of a set of pattern geometry parameters of the layout.

5. The method of claim 4, wherein the functions of the set of pattern geometry parameters include a set of polynomial functions of the set of pattern geometry parameters.

6. The method of claim 4, wherein the set of pattern geometry parameters can include one or more of:
    line-width;
    line-spacing;
    trench width;
    trench density;
    polygon width; and
    pattern density.

7. The method of claim 1, wherein after calibrating the photolithography process model, the method further comprises:
- receiving an output of the photolithography process model;
- receiving post-etch measured CD data for the layout which is measured after the etch process; and
- fitting an etch process model for modeling the etch process based at least on the post-etch measured CD data and the output of the photolithography process model.

8. The method of claim 7, wherein the method further comprises generating an Optical-Proximity-Correction (OPC) model by combining the fitted photolithography process model and the fitted etch process model.

9. A non-transitory computer-readable storage medium storing instructions that when executed by a computer cause the computer to perform a method for modeling a photolithography process, wherein the photolithography process is followed by an etch process, the method comprising:
- constructing an etch bias model which models a critical dimension (CD) difference between a measured CD value of a feature after the photolithography process and a measured CD value of the feature after the etch process;
- receiving measured CD data for a layout which is measured after the photolithography process; and
- fitting the photolithography process model based at least on the measured CD data and the etch bias model, wherein said fitting involves:
  - computing a residue of the photolithography process model based at least on the measured CD data;
  - computing a residue fitting target based at least on the etch bias model; and
  - fitting the photolithography process model so that the residue of the photolithography process model is substantially equal to the residue fitting target.

10. The non-transitory computer-readable storage medium of claim 9, wherein computing the residue of the photolithography process model involves:
- obtaining an output of the photolithography process model; and
- obtaining the residue of the photolithography process model by taking the difference between the measured CD data and the output of the photolithography process model.

11. The non-transitory computer-readable storage medium of claim 9, wherein computing the residue fitting target involves:
- computing an inverse function of the etch bias model; and
- normalizing the inversed etch bias model by a set of predetermined values so that the output of the inversed etch bias model has a substantially zero mean.

12. The non-transitory computer-readable storage medium of claim 9, wherein constructing the etch bias model involves modeling the CD difference as functions of a set of pattern geometry parameters of the layout.

13. The non-transitory computer-readable storage medium of claim 12, wherein the functions of the set of pattern geometry parameters include a set of polynomial functions of the set of pattern geometry parameters.

14. The non-transitory computer-readable storage medium of claim 12, wherein the set of pattern geometry parameters can include one or more of:
- line-width;
- line-spacing;
- trench width;
- trench density;
- polygon width; and
- pattern density.

15. The non-transitory computer-readable storage medium of claim 9, wherein after calibrating the photolithography process model, the method further comprises:
- receiving an output of the photolithography process model;
- receiving post-etch measured CD data for the layout which is measured after the etch process; and
- fitting an etch process model for modeling the etch process based at least on the post-etch measured CD data and the output of the photolithography process model.

16. The non-transitory computer-readable storage medium of claim 15, wherein the method further comprises generating an Optical-Proximity-Correction (OPC) model by combining the fitted photolithography process model and the fitted etch process model.

17. An apparatus that calibrates a photolithography process model for modeling a photolithography process, wherein the photolithography process is followed by an etch process, comprising:
- a constructing mechanism configured to construct an etch bias model which models a critical dimension (CD) difference between a measured CD value of a feature after the photolithography process and a measured CD value of the feature after the etch process;
- a receiving mechanism configured to receive measured CD data for a layout which is measured after the photolithography process; and
- a fitting mechanism configured to fit the photolithography process model based at least on the measured CD data and the etch bias model, wherein said fitting involves:
  - computing a residue of the photolithography process model based at least on the measured CD data;
  - computing a residue fitting target based at least on the etch bias model; and
  - fitting the photolithography process model so that the residue of the photolithography process model is substantially equal to the residue fitting target.

18. The apparatus of claim 17,
wherein the receiving mechanism is further configured to:
- receive an output of the photolithography process model; and
- receive post-etch measured CD data for the layout which is measured after the etch process; and wherein the fitting mechanism is further configured to fit an etch process model for modeling the etch process based at least on the post-etch measured CD data and the output of the photolithography process model.

19. The apparatus of claim 17, further comprising a combining mechanism configured to generate an Optical-Proximity-Correction (OPC) model by combining the fitted photolithography process model and the fitted etch process model.

* * * * *